United States Patent [19]

Hagura

[11] Patent Number: 5,341,340
[45] Date of Patent: Aug. 23, 1994

[54] SEMICONDUCTOR MEMORY DEVICE AND OPERATING METHOD

[75] Inventor: Tsukasa Hagura, Hyogo, Japan

[73] Assignee: Mitsubishi Denki Kabushiki Kaisha, Tokyo, Japan

[21] Appl. No.: 38,955

[22] Filed: Mar. 29, 1993

[30]   Foreign Application Priority Data

Mar. 30, 1992 [JP]   Japan .................................. 4-074304

[51] Int. Cl.$^5$ .................................................. G11C 7/00
[52] U.S. Cl. .................. 365/226; 365/189.09
[58] Field of Search ................... 365/226, 189.09, 229; 307/296.2, 296.6, 296.3, 264

[56]   References Cited
U.S. PATENT DOCUMENTS

| | | | |
|---|---|---|---|
| 4,455,628 | 6/1984 | Ozaki et al. | 365/226 |
| 4,585,954 | 4/1986 | Hashimoto et al. | 307/296.2 |
| 4,817,055 | 3/1989 | Arakawa et al. | 365/226 X |
| 5,146,110 | 9/1992 | Kim et al. | 307/296.2 |

FOREIGN PATENT DOCUMENTS 1-223693   9/1989   Japan .
2-61890    3/1990   Japan .

*Primary Examiner*—Eugene R. LaRoche
*Assistant Examiner*—Son Dinh
*Attorney, Agent, or Firm*—Lowe, Price, LeBlanc & Becker

[57]   ABSTRACT

A substrate bias generating circuit includes $V_{BB}$ generating circuits and a switching circuit. The switching circuit, in the standby period, applies an internal power supply voltage applied by an internal voltage down converting circuit to the $V_{BB}$ generating circuits. The switching circuit, in the active period, applies an external power supply voltage to the $V_{BB}$ generating circuits.

32 Claims, 14 Drawing Sheets

SEMICONDUCTOR MEMORY DEVICE AND OPERATING METHOD

BACKGROUND OF THE INVENTION

1. Field of the Invention

The present invention relates to semiconductor memory devices, and particularly to the improvement of substrate bias generating circuits of semiconductor memory devices.

2. Description of the Background Art

FIG. 12 is a block diagram showing a conventional dynamic type semiconductor memory device containing an internal voltage down converting circuit (Voltage Down Converter) therein.

The semiconductor memory device includes a dynamic random access memory (hereinafter referred to as a DRAM) 100, an internal voltage down converting circuit 200 and a substrate bias generating circuit 300. The DRAM 100, the internal voltage down converting circuit 200 and the substrate bias generating circuit 300 are formed on a semiconductor substrate CH.

The semiconductor memory device is supplied with an external power supply voltage Vcc and a ground voltage Vss. The internal voltage down converting circuit 200 converts the external power supply voltage Vcc down to a predetermined internal power supply voltage IVcc to supply the same to the DRAM 100. The internal voltage down converting circuit 200 is provided to improve reliability by reducing electric fields applied to gate oxide films of transistors, and reduce current consumption.

In order to always retain the semiconductor substrate CH at a predetermined potential, the substrate bias generating circuit 300 generates a substrate bias $V_{BB}$ of the predetermined potential. The substrate bias generating circuit 300 is provided for the following purposes.

In the inside of a CMOS integrated circuit, a parasitic bipolar transistor is structurally constructed. When electrons are injected from a input terminal to, for example, a P type semiconductor substrate by undershoot of an input waveform, the parasitic bipolar transistor operates, and latch-up takes place. As a result, data stored in memory cells are destroyed. It is necessary to prevent such a destruction of data.

In addition, a pn junction capacitance is formed between the semiconductor substrate and each node of the internal circuitry. If the pn junction capacitance is large, the high speed operation of the circuitry is prevented. Therefore, it is necessary to reduce such a pn junction capacitance.

Moreover, a threshold voltage of an MOS transistor depends on a potential of the semiconductor substrate. It is called a body effect of the threshold voltage of the transistor. When the potential of the P type semiconductor substrate is relatively low, the threshold voltage of the N channel MOS transistor hardly changes though the potential of the semiconductor substrate changes. However, when the potential of the P type semiconductor substrate is relatively high, the threshold voltage of the N channel MOS transistor considerably changes according to the change of the potential of the semiconductor substrate. It is thus necessary to always retain the potential of the P type semiconductor substrate low.

The substrate bias generating circuit 300 is provided to prevent destruction of memory cell data, allow high speed circuit operation by reducing a pn junction capacitance, and allow high speed and stabilized circuit operation by reducing a body effect of a threshold voltage.

FIG. 13 is a circuit diagram showing a structure of a conventional substrate bias generating circuit. A substrate bias generating circuit is disclosed in, for example, Japanese Patent Laying-Open Nos. 1-223693, 1-255095, and 2-61890.

The substrate bias generating circuit 300 includes two $V_{BB}$ generating circuits 31, 32. The $V_{BB}$ generating circuit 31 includes inverters G11 to G14, and a NOR gate G15, a capacitor C1 and N channel MOS transistors N11, N12.

The inverters G11 to G14 are connected in series and the output terminal of the inverter G14 is connected to one input terminal of the NOR gate G15. The output of the NOR gate G15 is connected to the input terminal of the inverter G11. The inverters G11 to G14 and the NOR gate G15 constitute a ring oscillator.

The other input terminal of the NOR gate G15 is connected to an enable terminal BBE. The output terminal of the NOR gate G15 (node NA) is connected to one electrode of the capacitor C1, and the other electrode of the capacitor C1 is connected to a node NB. The transistor N11 is connected between the node NB and an output terminal TO supplying the substrate bias $V_{BB}$, and the transistor N12 is connected between the node NB and a ground terminal. The enable terminal BBE is connected to the ground terminal.

The structure of the $V_{BB}$ generating circuit 32 is the same as that of the $V_{BB}$ generating circuit 31, except that a capacitor C2 included in the $V_{BB}$ generating circuit 32 has a larger capacitance value than that of the capacitor C1 included in the $V_{BB}$ generating circuit 31, and that the substrate bias $V_{BB}$ supplied from the output terminal TO of the $V_{BB}$ generating circuit 32 is applied to a level detector 33, and an enable terminal BBE is supplied with an output signal of the level detector 33.

FIG. 14 shows a structure of the inverter G11 included in the $V_{BB}$ generating circuits 31, 32. The inverter G11 includes a P channel MOS transistor P21 and an N channel MOS transistor N21. The transistor P21 is connected between a power supply terminal receiving the external power supply voltage Vcc and an output terminal b, and the transistor N21 is connected between the output terminal b and a ground terminal. The gates of the transistors P21, N21 are connected to an input terminal a. The structures of the inverters G12 to G14 are the same as that of the inverter G11.

FIG. 15 shows the structure of the NOR gate G15 included in the $V_{BB}$ generating circuits 31, 32. The NOR gate G15 includes P channel MOS transistors P31, P32 and N channel MOS transistors N31, N32. The transistors P31, P32 are connected in series between a power supply terminal receiving the external power supply voltage Vcc and an output terminal C. The transistors N31, N32 are connected in parallel between the output terminal C and a ground terminal. The gates of the transistors P32, N31 are connected to an input terminal A, and the gates of the transistors P31, N32 are connected to an input terminal B.

The inverters G11 to G14 and the NOR gate G15 of the $V_{BB}$ generating circuits 31, 32 are thus driven by the external power supply voltage Vcc.

Referring to a waveform diagram of FIG. 16, the operation of the $V_{BB}$ generating circuit 31 shown in FIG. 13 will now be described. In this figure, the threshold voltage of the transistors N11, N12 is Vth.

Since the enable terminal BBE of the $V_{BB}$ generating circuit 31 is connected to the ground terminal, the NOR gate G15 operates as an inverter. Consequently, the inverters G11 to G14 and the NOR gate G15 constitute a ring oscillator, and a potential of the node NA is a square wave changing repeatedly between the external power supply voltage Vcc and 0 V. By the operations of the capacitor C1 and the transistor N12, a potential of the node NB becomes a square wave changing repeatedly between the voltage Vth and the voltage Vth−Vcc. As a result, the substrate bias $V_{BB}$ at the 2 Vth−Vcc level is generated from the output terminal TO.

For example, when the external power supply voltage Vcc is 5 V, and the threshold voltage Vth of the transistors N11, N12 is 1 V, the substrate bias $V_{BB}$ is −3 V.

The $V_{BB}$ generating circuit 32 shown in FIG. 13 is activated in response to an output signal of the level detector 33.

The level detector 33 applies an output signal of "L" to the enable terminal BBE when the substrate bias $V_{BB}$ is higher than, for example, −2 V, whereby the $V_{BB}$ generating circuit 32 is activated. When the substrate bias $V_{BB}$ falls below −2 V, the level detector 33 applies an output signal of "H" to the enable terminal BBE, whereby the $V_{BB}$ generating circuit 32 is inactivated.

Briefly, both of the $V_{BB}$ generating circuit 31 having the small capacitor C1 and the $V_{BB}$ generating circuit 32 having the large capacitor C2 operate until the substrate bias $V_{BB}$ falls to −2 V, and when the substrate bias $V_{BB}$ becomes lower than −2 V, only the $V_{BB}$ generating circuit 31 having the small capacitor C1 operates. In the above described manner, the substrate bias $V_{BB}$, for example −3 V, is applied to the semiconductor substrate CH shown in FIG. 12.

As described above, in the conventional semiconductor memory device shown in FIG. 12, the semiconductor substrate CH is always supplied with the substrate bias $V_{BB}$ by means of the substrate bias generating circuit 300 driven by the external power supply voltage Vcc. Consequently, a problem of large power consumption arises.

SUMMARY OF THE INVENTION

One object of the present invention is to reduce power consumption of a substrate bias generating circuit included in a semiconductor memory device.

Another object of the present invention is to reduce power consumption of a substrate bias generating circuit in a semiconductor memory device including an internal voltage down converting circuit.

A still another object of the present invention is to reduce power consumption in a standby state in a dynamic random access memory including an internal voltage down converting circuit.

A semiconductor memory device according to the present invention is a semiconductor memory device formed on a semiconductor substrate, including a converting circuit, a storage circuit, a substrate bias generating circuit, and a switching circuit.

The converting circuit converts an external power supply voltage into an internal power supply voltage lower than the external power supply voltage. The storage circuit is driven by the internal power supply voltage to store data. The substrate bias generating circuit is driven by the external power supply voltage or the internal power supply voltage to generate a substrate bias for retaining the voltage of the semiconductor substrate constant. Depending on whether the storage circuit is in an active state or in a standby state, a drive voltage of the substrate bias generating circuit is switched between the external power supply voltage and the internal power supply voltage.

The switching circuit may supply the substrate bias generating circuit with the external power supply voltage as a drive voltage when the storage circuit is in the active state, and may supply the substrate bias generating circuit with the internal power supply voltage as a drive voltage when the storage circuit is in the standby state.

The substrate bias generating circuit may include a first substrate bias generating circuit driven by the external power supply voltage, and a second substrate bias generating circuit driven by the internal power supply voltage. The switching circuit activates the first substrate bias generating circuit and inactivates the second substrate bias generating circuit when the storage circuit is in the active state, and inactivates the first substrate bias generating circuit and activates the second substrate bias generating circuit when the storage circuit is in the standby state.

The substrate bias generating circuit may include a first substrate bias generating circuit driven by the external power supply voltage, and a second substrate bias generating circuit driven by the internal power supply voltage. The second substrate bias generating circuit is always in the active state. The switching circuit activates the first substrate bias generating circuit when the storage circuit is in the active state, and inactivates the first substrate bias generating circuit when the storage circuit is in the standby state.

In the semiconductor memory device, the drive voltage of the substrate bias generating circuit is switched depending on whether the storage circuit is in the active state or in the standby state. Consequently, dissipated power by the substrate bias generating circuit in the standby state, and thus power consumption in the semiconductor memory device can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
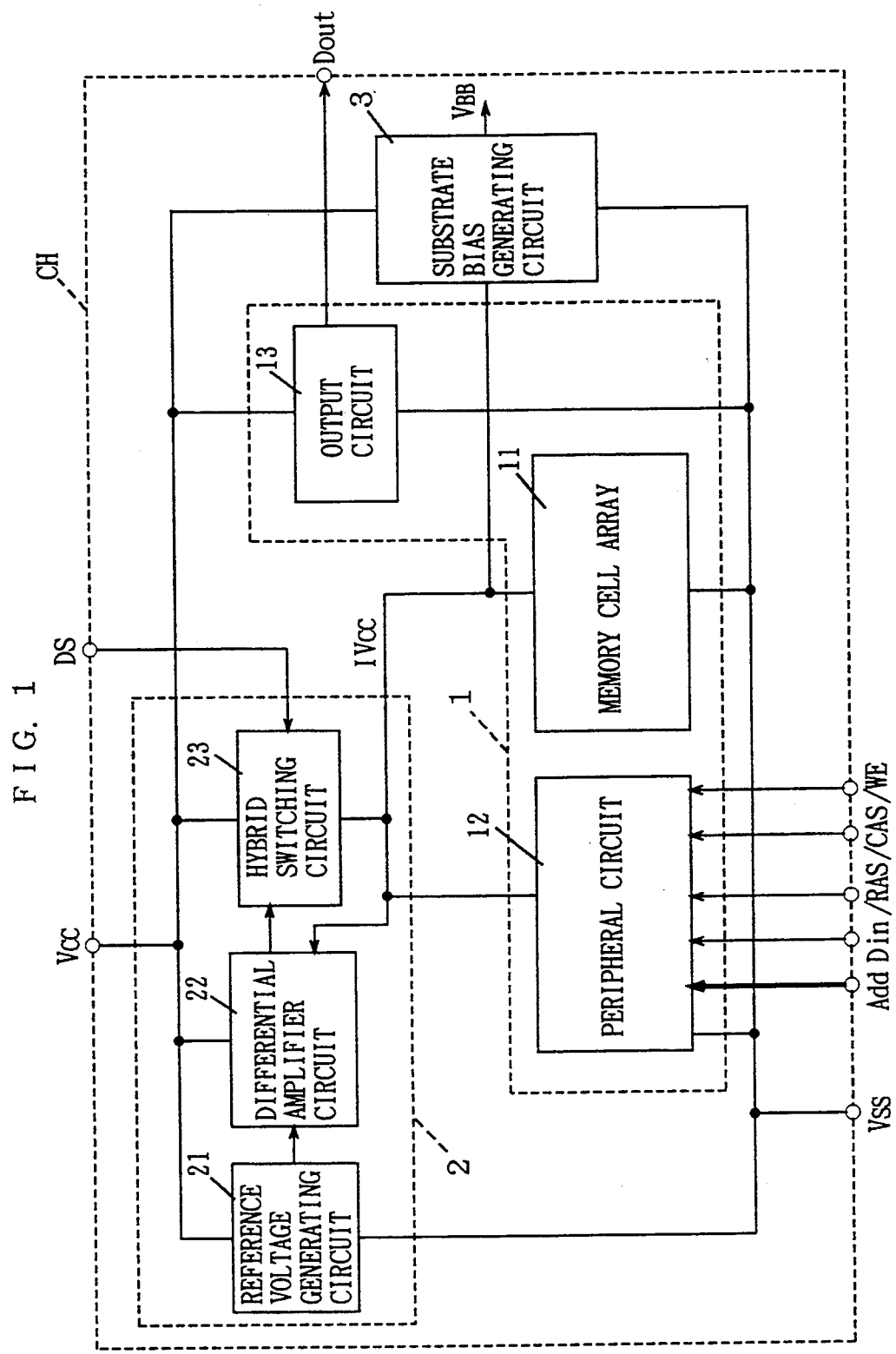
FIG. 1 is a block diagram showing the entire structure of a semiconductor memory device according to a first embodiment of the present invention.

FIG. 1 is a block diagram showing the entire structure of a semiconductor memory device according to a first embodiment of the present invention. In FIG. 1, a DRAM 1, an internal voltage down converting circuit 2 and a substrate bias generating circuit 3 are formed on the semiconductor substrate CH. The external power supply voltage Vcc and the ground voltage Vss are supplied to the semiconductor memory device.

The DRAM 1 includes a memory cell array 11, a peripheral circuit 12 and an output circuit 13. The peripheral circuit 12 is supplied with an address signal Add, an external row address strobe signal /RAS, an external column address strobe signal /CAS, and an external write enable signal /WE. The peripheral circuit 12 is also supplied with input data Din externally. The output circuit 13 provides output data Dout to the outside.

The internal voltage down converting circuit 2 includes a reference voltage generating circuit 21, a differential amplifier circuit 22 and a hybrid switching circuit 23. The internal voltage down converting circuit 2 converts the external power supply voltage Vcc down to the predetermined internal power supply voltage IVcc. The external power supply voltage Vcc is, for example, 5 V, and the internal power supply IVcc is, for example, 4 V. The hybrid switching circuit 23 is activated, or inactivated by a control signal DS.

The memory cell array 11 and the peripheral circuit 12 in the DRAM 1 are supplied with the internal power supply voltage IVcc, and the output circuit 13 is supplied with the external power supply voltage Vcc.

The substrate bias generating circuit 3 is driven by the external power supply voltage Vcc or the internal power supply voltage IVcc, to generate the substrate bias $V_{BB}$. The substrate bias $V_{BB}$ is, for example, $-3$ V.

Figure 2:
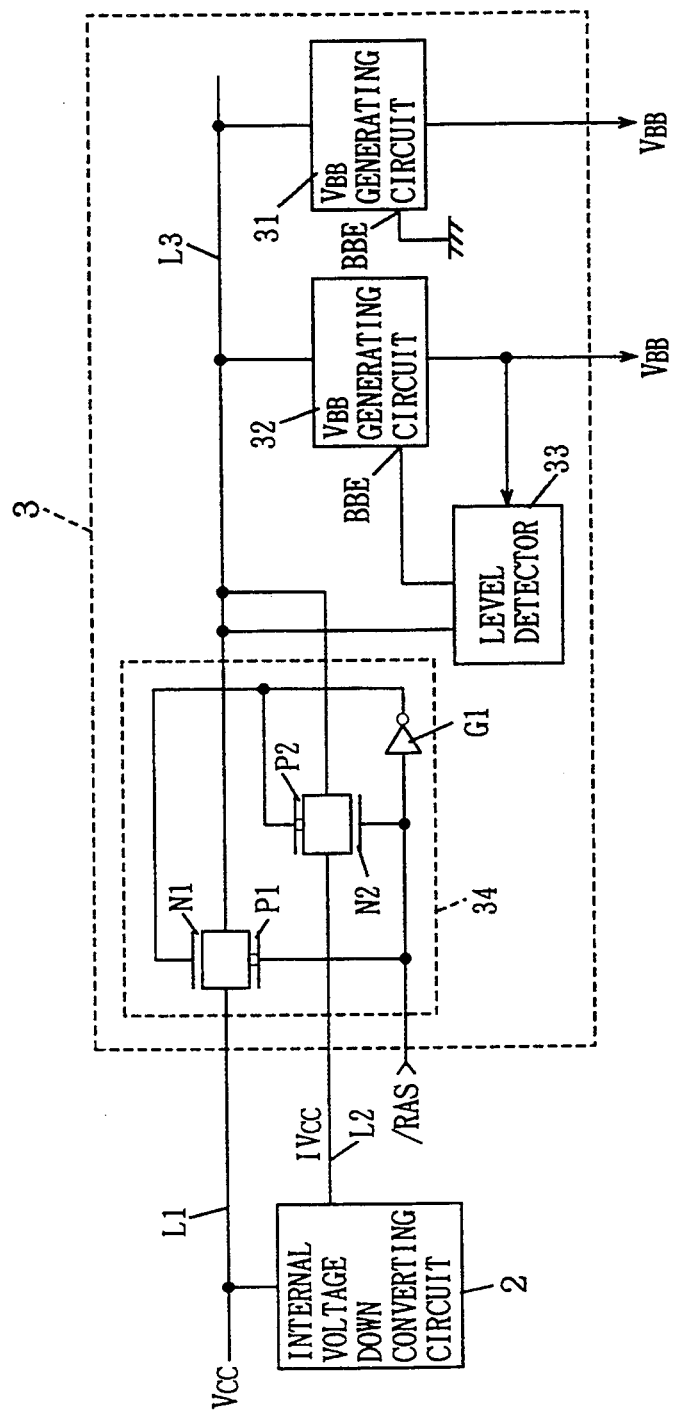
FIG. 2 is a circuit diagram showing a structure of a substrate bias generating circuit included in the semiconductor memory device according to the first embodiment of the present invention.

FIG. 2 shows a detailed structure of the substrate bias generating circuit 3. The substrate bias generating circuit 3 includes the $V_{BB}$ generating circuits 31, 32, the level detector 33 and a switching circuit 34. The $V_{BB}$ generating circuit 31, having a small capacitor, has the same structure as that of the $V_{BB}$ generating circuit 31 shown in FIG. 13. An enable terminal BBE of the $V_{BB}$ generating circuit 31 is connected to a ground terminal. Therefore, the $V_{BB}$ generating circuit 31 is always in the active state.

Figure 13:
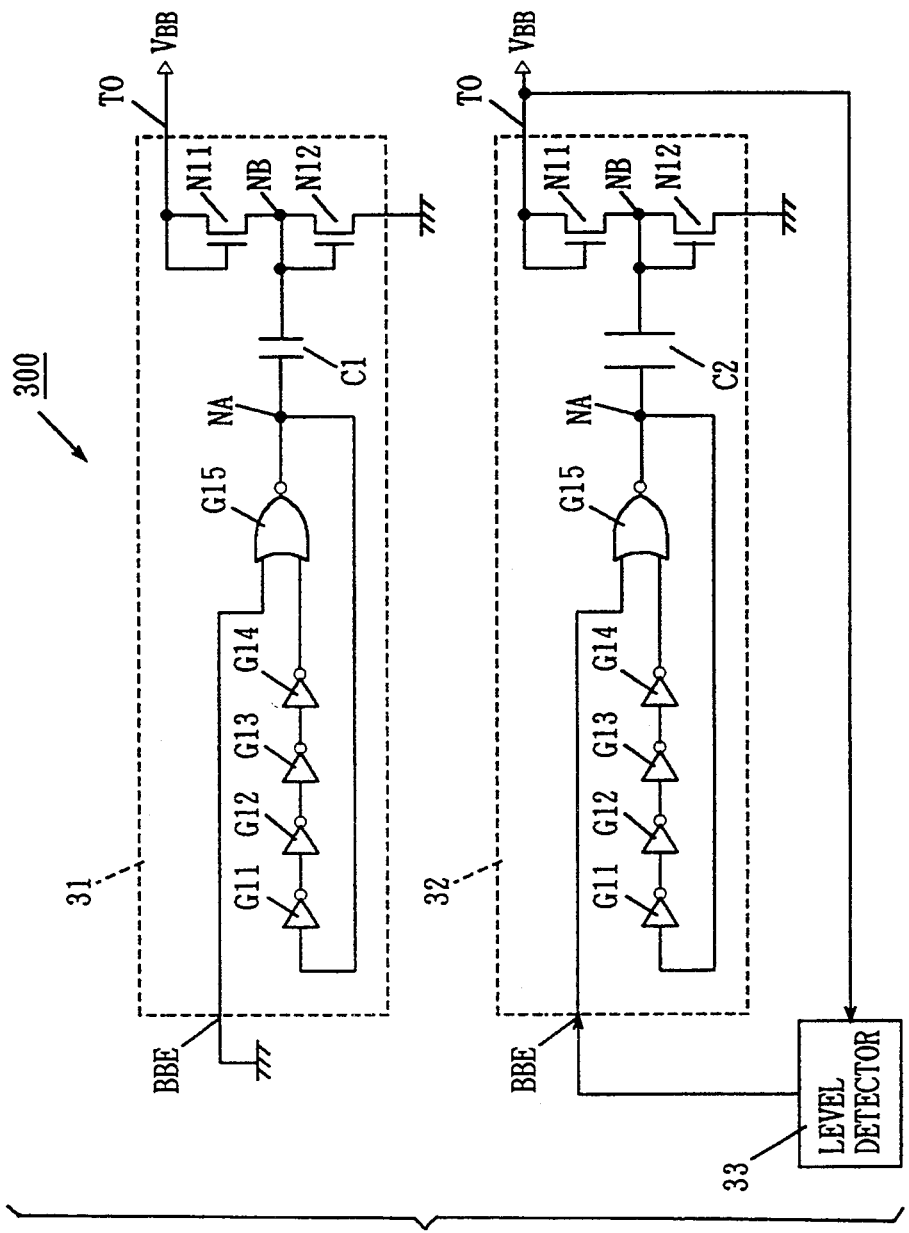
FIG. 13 is a circuit diagram showing a structure of a substrate bias generating circuit included in the semiconductor memory device of FIG. 12.
Figure 14:
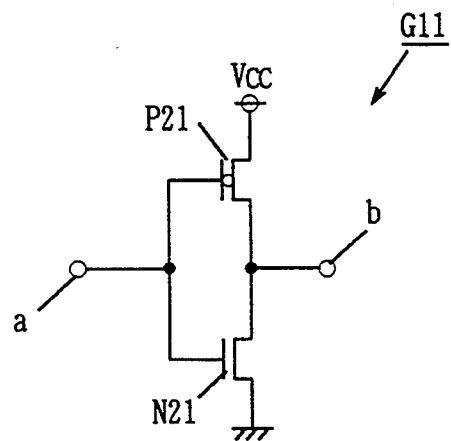
FIG. 14 is a circuit diagram showing a structure of an inverter included in the substrate bias generating circuit of FIG. 13.
Figure 15:
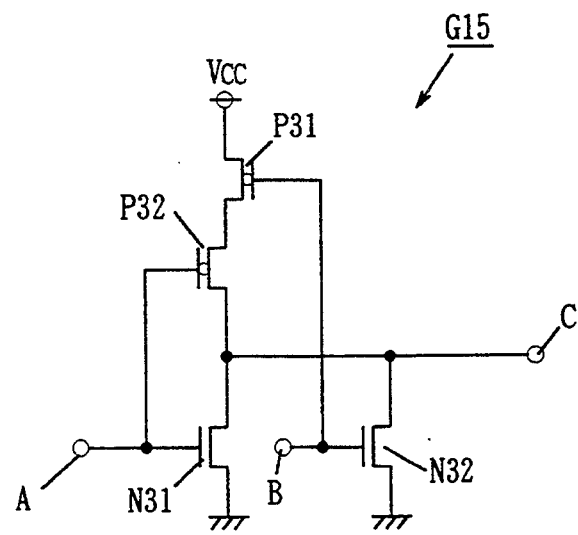
FIG. 15 is a circuit diagram showing a structure of a NOR gate included in the substrate bias generating circuit of FIG. 13.
Figure 16:
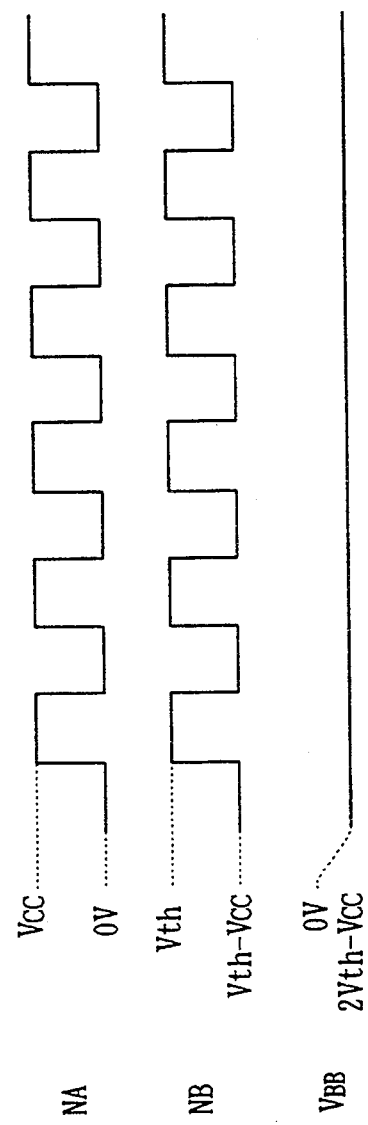
FIG. 16 is a waveform diagram showing the operation of the substrate bias generating circuit of FIG. 13.

The $V_{BB}$ generating circuit 32, having a large capacitor, has the same structure as that of the $V_{BB}$ generating circuit 32 shown in FIG. 13. The level detector 33 receives the substrate bias $V_{BB}$ provided from the $V_{BB}$ generating circuit 32, and applies an output signal to an enable terminal BBE of the $V_{BB}$ generating circuit 32, whereby the $V_{BB}$ generating circuit 32 is in the active state when the substrate bias $V_{BB}$ is higher than, for example, $-2$ V, and is in the inactive state when the substrate bias $V_{BB}$ falls below $-2$ V.

The switching circuit 34 includes P channel MOS transistors P1, P2, N channel MOS transistors N1, N2, and an inverter G1. The switching circuit 34 responds to the external row address strobe signal /RAS to selectively supply a power supply line L3 with the external power supply voltage Vcc applied to a power supply line L1, or with the internal power supply voltage IVcc applied to a power supply line L2 by the internal voltage down converting circuit 2. The $V_{BB}$ generating circuits 31, 32 are connected to the power supply line L3.

The DRAM 1 shown in FIG. 1 is in a standby state when the external row address strobe signal /RAS is "H", and is in an active state when the external row address strobe signal /RAS is "L".

Figure 3:
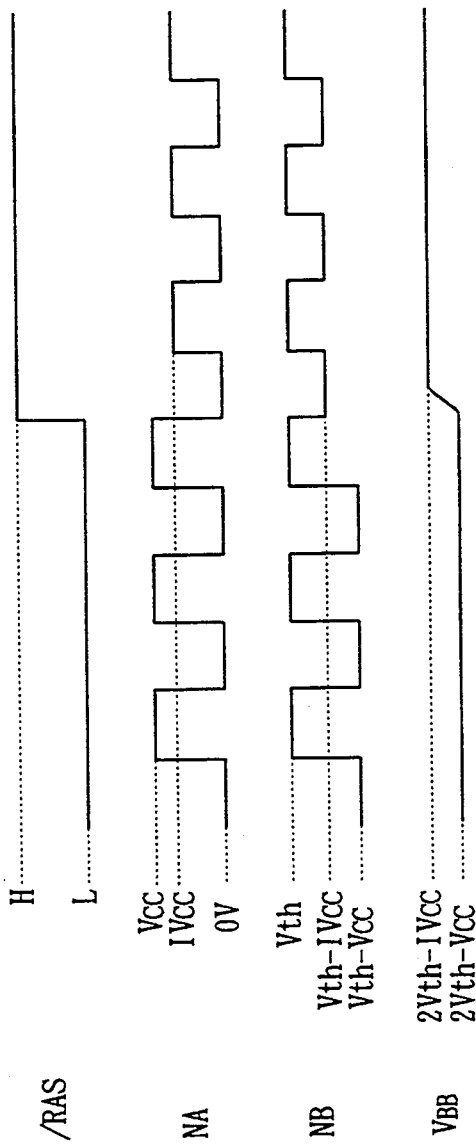
FIG. 3 is a waveform diagram showing the operation of the substrate bias generating circuit shown in FIG. 2.

Referring to a waveform diagram of FIG. 3, the operation of the substrate bias generating circuit 3 shown in FIG. 2 will now be described.

When the external row address strobe signal /RAS is "L" (an active state), the transistors P1, N1 are turned on, and the transistors P2, N2 are turned off, so that the external power supply voltage Vcc applied to the power supply line L1 is supplied to the power supply line L3. As a result, the $V_{BB}$ generating circuits 31, 32 are driven by the external power supply voltage Vcc.

At this time, the potential of the node NA (see FIG. 13) in the $V_{BB}$ generating circuits 31, 32 is a square wave changing repeatedly between the external power supply voltage Vcc and 0 V. The potential of the node NB (see FIG. 13) is a square wave changing repeatedly between the voltage Vth and the voltage Vth−Vcc. Consequently, the substrate bias $V_{BB}$ is 2 Vth−Vcc.

For example, if the external power supply voltage Vcc is 5 V, and the threshold voltage Vth of the transistors N11, N12 (see FIG. 13) is 1 V, the substrate bias $V_{BB}$ is $-3$ V.

When the external row address strobe signal /RAS is "H" (a standby state), the transistors P1, N1 are turned off, the transistors P2, N2 are turned on, so that the internal power supply voltage IVcc applied to the power supply line L2 is supplied to the power supply line L3. As a result, the $V_{BB}$ generating circuits 31, 32 are driven by the internal power supply voltage IVcc.

At this time, the potential of the node NA in the $V_{BB}$ generating circuits 31, 32 is a square wave changing repeatedly between the internal power supply voltage IVcc and 0 V. The potential of the node NB is a square wave changing repeatedly between the voltage Vth and the voltage Vth−IVcc. Consequently, the substrate bias $V_{BB}$ is 2 Vth−IVcc.

If the internal power supply voltage IVcc is 4 V, for example, the substrate bias $V_{BB}$ is $-2$ V.

Briefly, when the DRAM 1 is in the active state, the $V_{BB}$ generating circuits 31, 32 are driven by the external power supply voltage Vcc, and when the DRAM 1 is in the standby state, the $V_{BB}$ generating circuits 31, 32 are driven by the internal power supply voltage IVcc. Accordingly, power consumption in the standby state can be reduced. No problem arises even if the potential of the semiconductor substrate CH rises from $-3$ V to $-2$ V in the standby state.

Figure 4:
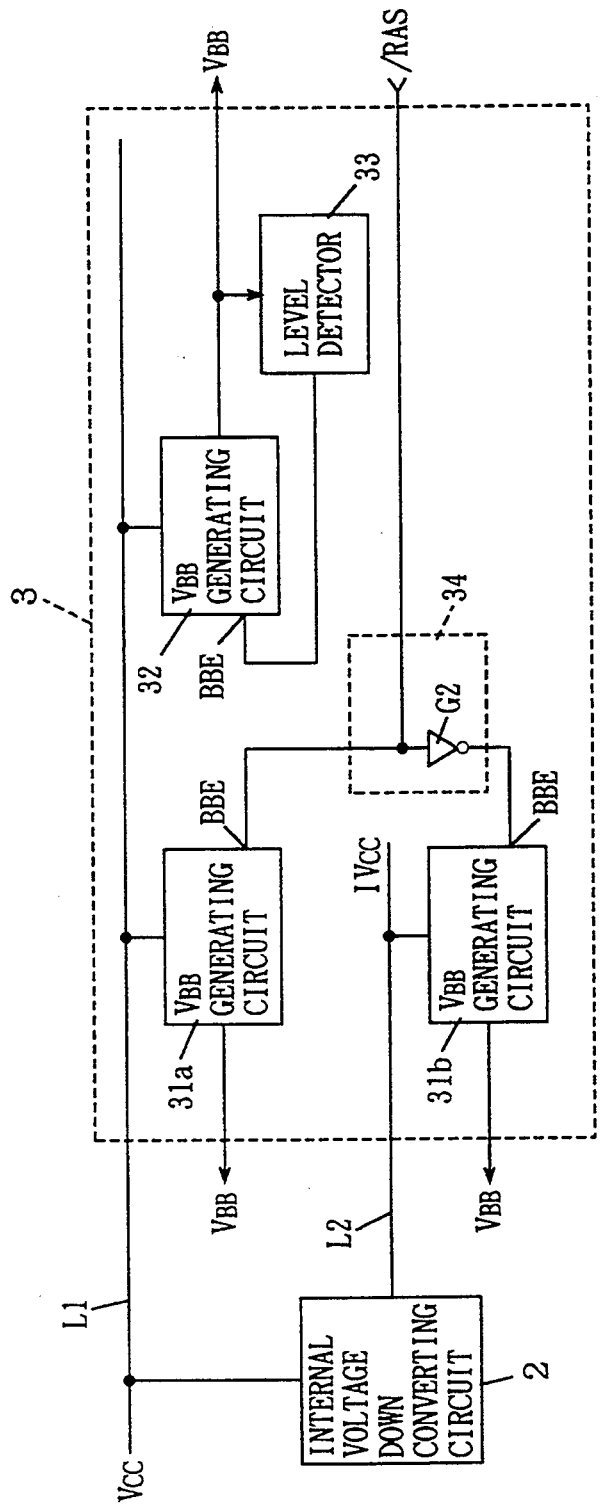
FIG. 4 is a block diagram showing a structure of a substrate bias generating circuit included in a semiconductor memory device according to a second embodiment of the present invention.

FIG. 4 is a circuit diagram showing a detailed structure of a substrate bias generating circuit of a semiconductor memory device according to a second embodiment of the present invention. The entire structure of the semiconductor memory device of the present embodiment is the same as that shown in FIG. 1.

The substrate bias generating circuit 3 includes a first $V_{BB}$ generating circuit 31a, a second $V_{BB}$ generating circuit 31b, a $V_{BB}$ generating circuit 32, a level detector 33 and a switching circuit 34.

The first $V_{BB}$ generating circuit 31a, including a small capacitor, has the same structure as that of the $V_{BB}$ generating circuit 31 shown in FIG. 13. Similarly, the second $V_{BB}$ generating circuit 31b, including a small capacitor, has the same structure as that of the $V_{BB}$ generating circuit 31 shown in FIG. 13. The first $V_{BB}$ generating circuit 31a is connected to the power supply line L1 supplied with the external power supply voltage Vcc. The second $V_{BB}$ generating circuit 31b is connected to the power supply line L2 supplied with the internal power supply voltage IVcc by the internal voltage down converting circuit 2. Accordingly, the first $V_{BB}$ generating circuit 31a is driven by the external power supply voltage Vcc, and the second $V_{BB}$ generating circuit 31b is driven by the internal power supply voltage IVcc.

The $V_{BB}$ generating circuit 32, including a large capacitor, has the same structure as that of the $V_{BB}$ generating circuit 32 shown in FIG. 13. The $V_{BB}$ generating circuit 32 is connected to the power supply line L1. The level detector 33 receives the substrate bias $V_{BB}$ provided from the $V_{BB}$ generating circuit 32 to apply an output signal to an enable terminal BBE of the $V_{BB}$ generating circuit 32. The operations of the $V_{BB}$ generating circuit 32 and the level detector 33 are the same as those of the $V_{BB}$ generating circuit 32 and the level detector 33 shown in FIG. 2, respectively.

The switching circuit 34 includes an inverter G2. An enable terminal BBE of the first $V_{BB}$ generating circuit 31a is supplied with the external row address strobe /RAS and an enable terminal BBE of the second $V_{BB}$ generating circuit 31b is supplied with the external row address strobe signal /RAS through the inverter G2.

Figure 5:
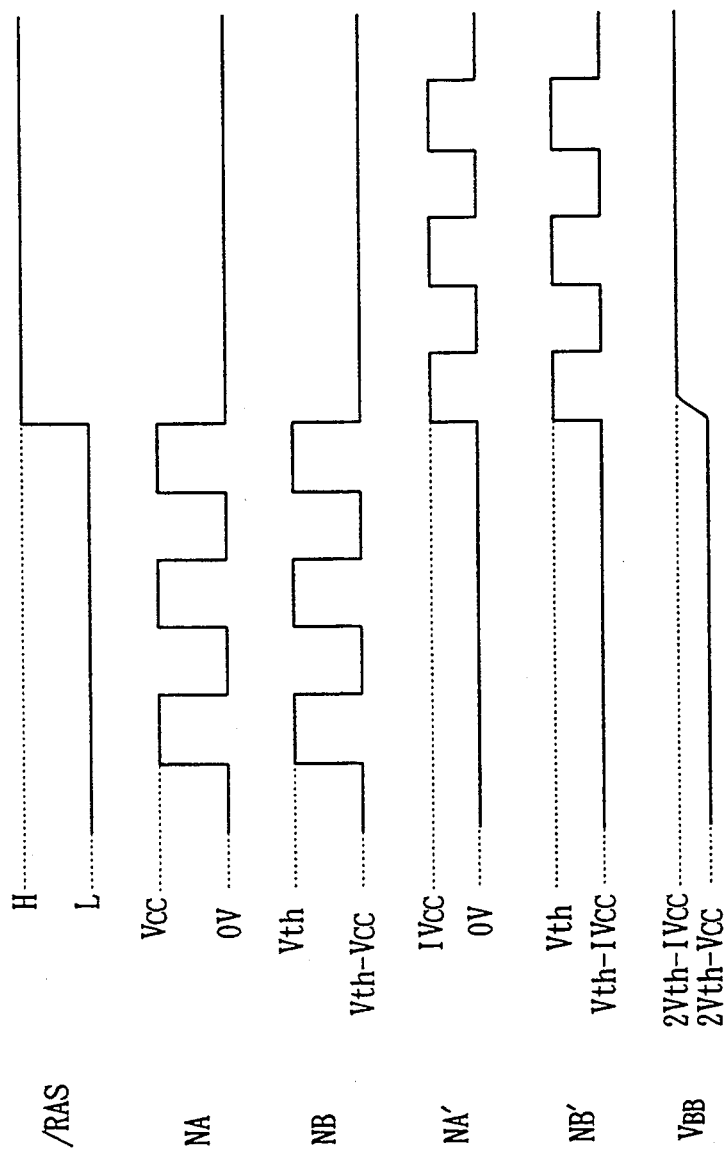
FIG. 5 is a waveform diagram showing the operation of the substrate bias generating circuit shown in FIG. 4.

Referring to the waveform diagram of the FIG. 5, the operation of the substrate bias generating circuit 3 shown in FIG. 4 will be described. In FIG. 5, NA and NB denote the potentials of the nodes NA and NB in the first $V_{BB}$ generating circuit 31a (see FIG. 13), and NA' and NB' denote the potentials of the nodes NA and NB in the second $V_{BB}$ generating circuit 31b (see FIG. 13).

When the external row address strobe signal /RAS is "L" (an active state), the first $V_{BB}$ generating circuit 31a is in an active state, and the second $V_{BB}$ generating circuit 31b is in an inactive state.

At this time, the potential of the node NA in the first $V_{BB}$ generating circuit 31a is a square wave changing repeatedly between the external power supply voltage Vcc and 0 V. The potential of the node NB in the first $V_{BB}$ generating circuit 31a is a square wave changing repeatedly between the voltage Vth and the voltage Vth−Vcc.

At this time, since the second $V_{BB}$ generating circuit 31b is in the inactive state, the potential of the node NA (NA') in the second $V_{BB}$ generating circuit 31b is 0 V, and the potential of the node NB (NB') is the voltage Vth−IVcc.

As a result, the substrate bias $V_{BB}$ is 2 Vth−Vcc. If the external power supply voltage Vcc is, for example, 5 V, and the threshold voltage Vth of the transistors N11, N12 (see FIG. 13) in the first $V_{BB}$ generating circuit 31a is, for example, 1 V, the substrate bias $V_{BB}$ is $-3$ V.

When the external row address strobe signal /RAS is "H" (a standby state), the first $V_{BB}$ generating circuit 31a enters an inactive state, and the second $V_{BB}$ generating circuit 31b enters an active state.

Consequently, the potential of the node NA (NA') in the second $V_{BB}$ generating circuit 31b is a square wave changing repeatedly between the internal power supply voltage IVcc and 0 V. The potential of the node NB (NB') in the second $V_{BB}$ generating circuit 31b is a square wave changing repeatedly between the voltage Vth and the voltage Vth−IVcc.

At this time, since the first $V_{BB}$ generating circuit 31a is in the inactive state, the potential of the node NA in the first $V_{BB}$ generating circuit 31a is 0 V, and the potential of the node NB is Vth−Vcc. Consequently, the substrate bias $V_{BB}$ is 2 Vth-IVCC. If the internal power supply voltage IVcc is, for example 4 V, the substrate bias $V_{BB}$ is $-2$ V.

Briefly, when the DRAM 1 is in the active state, the first $V_{BB}$ generating circuit 31a driven by the external power supply voltage Vcc operates, and when the DRAM 1 is in the standby state, the second $V_{BB}$ generating circuit 31b driven by the internal power supply voltage IVcc operates. Accordingly, power consumption in the standby state can be reduced.

Figure 6:
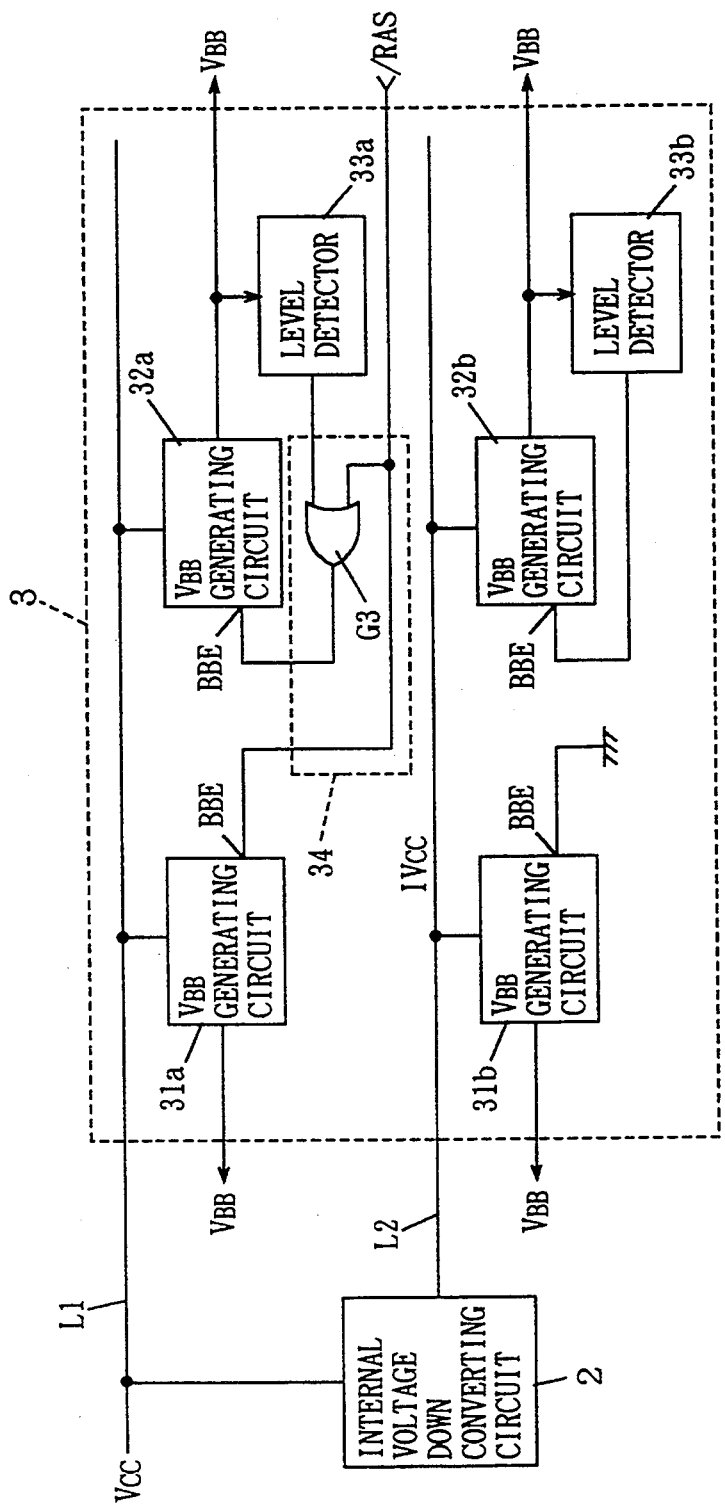
FIG. 6 is a block diagram showing a structure of a substrate bias generating circuit included in a semiconductor memory device according to a third embodiment of the present invention.

FIG. 6 is a diagram showing a detailed structure of a substrate generating circuit of a semiconductor memory device according to a third embodiment of the present invention. The entire structure of the semiconductor memory device of the present embodiment is the same as that shown in FIG. 1.

The substrate bias generating circuit 3 includes a first $V_{BB}$ generating circuit 31a, a second $V_{BB}$ generating circuit 31b, a third $V_{BB}$ generating circuit 32a, a fourth $V_{BB}$ generating circuit 32b, level detectors 33a, 33b, and a switching circuit 34.

The first $V_{BB}$ generating circuit 31a, having a small capacitor, has the same structure as that of the $V_{BB}$ generating circuit shown in FIG. 13. Similarly, the second $V_{BB}$ generating circuit 31b, having a small capacitor, has the same structure as that of the $V_{BB}$ generating circuit 31 shown in FIG. 13.

The first $V_{BB}$ generating circuit 31a is connected to the power supply line L1 supplied with the external power supply voltage Vcc. The second $V_{BB}$ generating circuit 31b is connected to the power supply line L2 supplied with the internal power supply voltage IVcc by the internal voltage down converting circuit 2.

An enable terminal BBE of the first $V_{BB}$ generating circuit 31a is supplied with the external row address strobe signal /RAS. An enable terminal BBE of the second $V_{BB}$ generating circuit 31b is connected to a ground terminal. Therefore, the first $V_{BB}$ generating circuit 31a is activated or inactivated in response to the external row address strobe signal /RAS, while the second generating circuit 31b is always in the active state.

The third $V_{BB}$ generating circuit 32a, having a large capacitor, has the same structure as that of the $V_{BB}$ generating circuit 32 shown in FIG. 13. Similarly, the fourth $V_{BB}$ generating circuit 32b, having a large capacitor, has the same structure as that of the $V_{BB}$ generating circuit 32 shown in FIG. 13.

The third $V_{BB}$ generating circuit 32a is connected to the power supply line L1 supplied with the external power supply voltage Vcc. The fourth $V_{BB}$ generating circuit 32b is connected to the power supply line L2 supplied with the internal power supply voltage IVcc.

The switching circuit 34 includes an OR gate G3. The level detector 33a receives the substrate bias $V_{BB}$ provided from the third $V_{BB}$ generating circuit 32a to apply an output signal to one input terminal of the OR gate G3. The other input terminal of the OR gate G3 is supplied with the external row address strobe signal /RAS. The output signal of the OR gate G3 is applied to an enable terminal BBE of the third $V_{BB}$ generating circuit 32a.

When the external row address strobe signal /RAS is "L" (an active state), the third $V_{BB}$ generating circuit 32a and the level detector 33a operate similarly to the $V_{BB}$ generating circuit 32 and the level detector 33 shown in FIG. 2. When the external row address strobe signal /RAS is "H" (a standby state), the output signal of the OR gate G3 is "H", so that the third $V_{BB}$ generating circuit 32a enters an inactive state.

The level detector 33b receives the substrate bias $V_{BB}$ provided from the fourth $V_{BB}$ generating circuit 32b to apply an output signal to an enable terminal BBE of the fourth $V_{BB}$ generating circuit 32b. The operations of the fourth $V_{BB}$ generating circuit 32b and the level detector 33b is the same as those of the $V_{BB}$ generating circuit 32 and the level detector 33 shown in FIG. 2.

Figure 7:
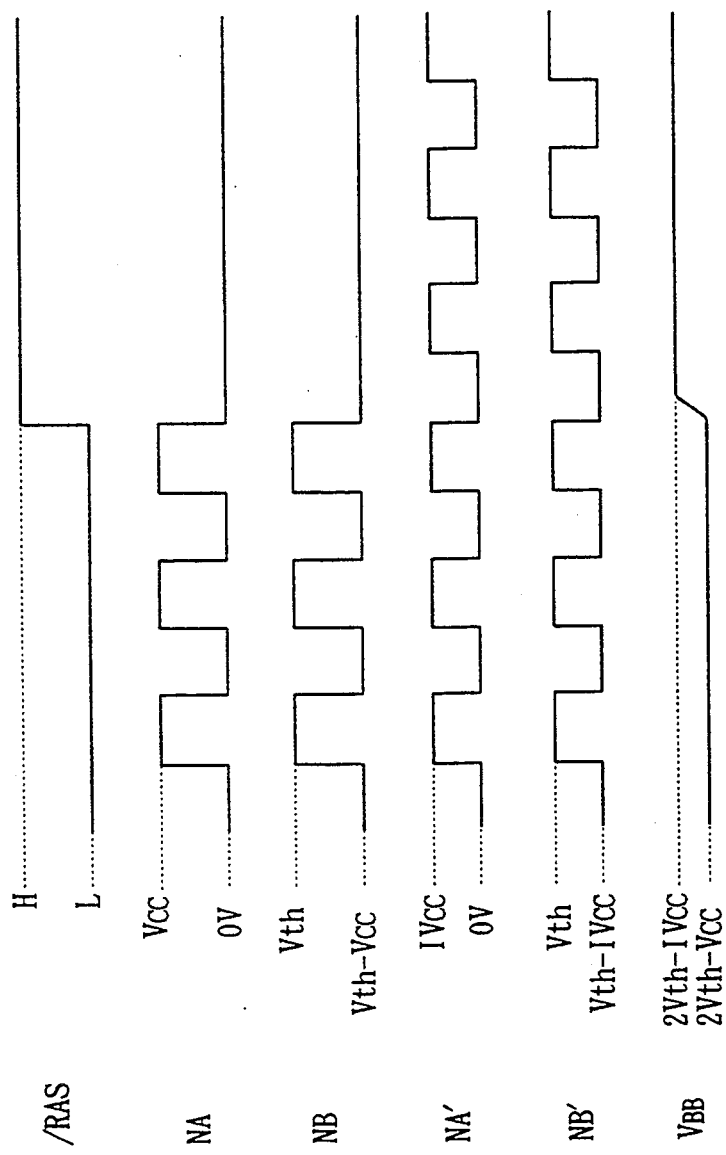
FIG. 7 is a waveform diagram showing the operation the substrate bias generating circuit of FIG. 6.

Referring to a waveform diagram of FIG. 7, the operation of the substrate bias generating circuit 3 shown in FIG. 6 will be described. In FIG. 7, NA and NB denote the potentials of the nodes NA and NB in the first $V_{BB}$ generating circuit 31a (see FIG. 13), and NA' and NB' denote the potentials of the nodes NA and NB in the second $V_{BB}$ generating circuit 31b (see FIG. 13).

The second $V_{BB}$ generating circuit 31b is always in the active state. Therefore, the potential of the node NA (NA') in the second $V_{BB}$ generating circuit 31b is a square wave changing repeatedly between the internal power supply voltage IVcc and 0 V. The potential of the node NB (NB') in the second $V_{BB}$ generating circuit 31b is a square wave changing repeatedly between the voltage Vth and the voltage Vth−IVcc.

When the external row address strobe signal /RAS is "L" (an active state), the first $V_{BB}$ generating circuit 31a is in the active state. Therefore, the potential of the node NA in the first $V_{BB}$ generating circuit 31a is a square wave changing repeatedly between the external power supply voltage Vcc and 0 V. The potential of the node NB in the first $V_{BB}$ generating circuit 31a is a square wave changing repeatedly between the voltage Vth and the voltage Vth−Vcc.

As a result, the substrate bias $V_{BB}$ is 2 Vth−Vcc. If the external power supply voltage Vcc is, for example, 5 V, and the threshold voltage Vth of the transistors N11, N12 (see FIG. 13) in the first $V_{BB}$ generating circuit 31a is, for example, 1 V, the substrate bias $V_{BB}$ is −3 V.

When the external row address strobe signal /RAS is "H" (a standby state), the first $V_{BB}$ generating circuit 31a enters an inactive state. Therefore, the potential of the node NA in the first $V_{BB}$ generating circuit 31a is 0 V, and the potential of the node NB is Vth−Vcc. In this case, the substrate bias $V_{BB}$ is supplied by the second $V_{BB}$ generating circuit 31b to be 2 Vth−IVcc. If the internal power supply voltage IVcc is 4 V, the substrate bias $V_{BB}$ is −2 V.

Briefly, when the DRAM 1 is in the active state, the first and second $V_{BB}$ generating circuits 31a, 31b operate together, and when the DRAM 1 is in the standby state, the first $V_{BB}$ generating circuit 31a stops and the second $V_{BB}$ generating circuit 31b operates. Accordingly, power consumption in the standby state can be reduced.

Power supplying capability of the first $V_{BB}$ generating circuit 31a is set smaller compared to that of the second $V_{BB}$ generating circuit 31b. A longer oscillation period of a ring oscillator included in a $V_{BB}$ generating circuit causes a less feedthrough current of each inverter, and a smaller power supply capability. The oscillation period becomes longer as the number of inverters constituting the ring oscillator increases.

Figure 8:
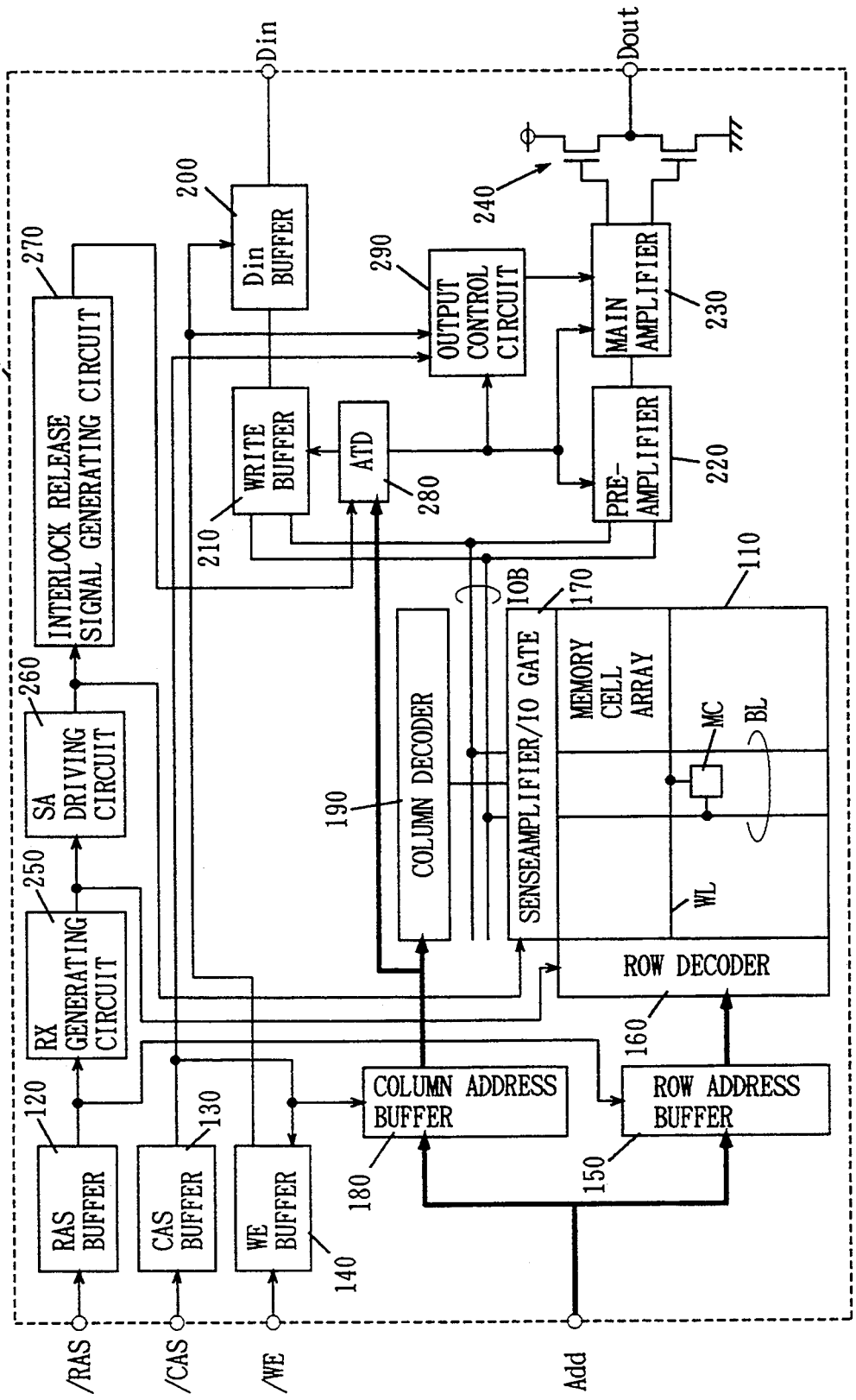
FIG. 8 is a block diagram showing one example of a structure of a DRAM included in the semiconductor memory device of FIG. 1.

FIG. 8 is an example of the structure of the DRAM 1.

In FIG. 8, a memory cell array 110 includes a plurality of word lines, a plurality of bit line pairs BL crossing the plurality of word lines, and a plurality of memory cells provided at crossings of the word lines and the bit lines. FIG. 8 shows only one word line WL, one bit line pair BL, and one memory cell MC therein.

A RAS buffer 120 receives the external row address strobe signal /RAS to generate an internal row address strobe signal. A CAS buffer 130 receives the external column address strobe signal /CAS to generate an internal column address strobe signal. A WE buffer 140 receives the external write enable signal /WE to generate an internal write enable signal.

A row address buffer 150 receives an externally applied address signal Add to generate a row address signal. A row decoder 160 selects one of the plurality of word lines WL in the memory cell array 110 in response to the row address signal. Thus, data is read from the plurality of memory cells MC connected to the selected word line WL to the corresponding bit line pairs BL, respectively. The data read onto each bit line pair BL is amplified by a sense amplifier included in a sense amplifier /IO gate 170.

A column address buffer 180 receives the externally applied address signal Add to generate a column address signal. A column decoder 190 selects any of the plurality of bit line pairs BL in the memory cell array 110 in response to the column address signal. Thus, the selected bit line pair BL is connected to an input/output line pair IOB by an IO gate included in the sense amplifier /IO gate 170.

In writing data, externally applied input data Din is applied through a Din buffer 200 and a write buffer 210 to the input/output line pair IOB.

In reading data, data on the input/output line pair IOB is amplified by a preamplifier 220 and a main amplifier 230, and the amplified data is provided as an output data Dout through an output buffer 240.

An RX generating circuit 250 generates a drive signal for driving the row decoder 160 in response to the internal row address strobe signal. An SA driving circuit 260 generates a drive signal for driving the sense amplifier in the sense amplifier /IO gate 170 in response to the output signal of the RX generating circuit 250. An interlock release signal, generating circuit 270 generates an interlock release signal in response to the output signal of the SA driving circuit 260. An ATD generating circuit 280 controls the write buffer 210, the preamplifier 220, the main amplifier 230 and an output control circuit 290 in response to the column address signal and the interlock release signal. The output control circuit 290 controls the main amplifier 230.

The memory cell array 110, the row decoder 160, the sense amplifier /IO gate 170, the column decoder 190 and the input/output line pair IOB are included in the memory cell array 11 shown in FIG. 1. The output buffer 240 is included in the output circuit 13 shown in FIG. 1. The other circuits are included in the peripheral circuit 12 shown in FIG. 1.

The structure of the DRAM 1 shown in FIG. 1 is not limited to the structure shown in FIG. 8.

Figure 9:
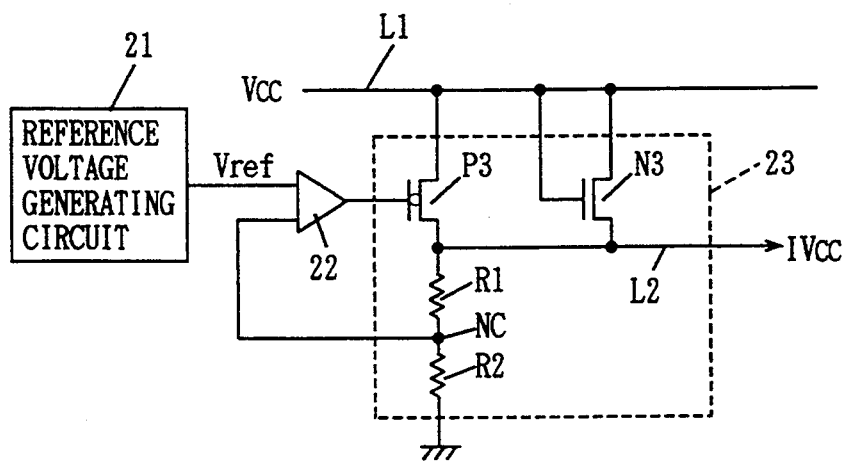
FIG. 9 is a circuit diagram showing one example of a structure of an internal voltage down converting circuit included in the semiconductor memory device of FIG. 1.

FIG. 9 shows one example of a structure of an internal voltage down converting circuit. In FIG. 9, a reference voltage generating circuit 21 generates a predetermined reference voltage Vref. The reference voltage Vref is, for example, 4 V.

Figure 10:
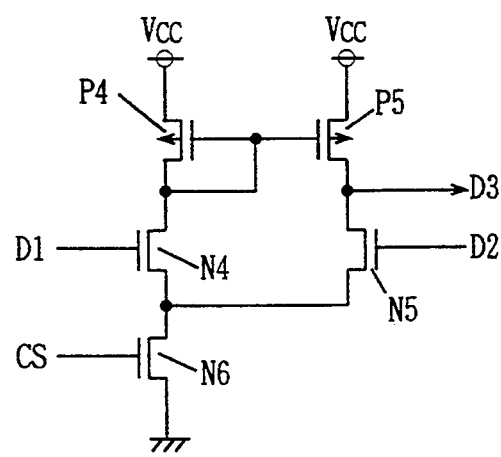
FIG. 10 is a circuit diagram showing one example of a structure of a differential amplifier circuit included in the internal voltage down converting circuit of FIG. 9.

The differential amplifier circuit 22 is comprised of a current mirror amplifier as shown in FIG. 10, for example. The current mirror amplifier includes P channel MOS transistors P4, P5 and N channel MOS transistors N4, N5, N6. The current mirror amplifier is activated when a control signal CS applied to the gate of the transistor N6 is "H". The gate of the transistor N4 is supplied with an input voltage D1, and the gate of the transistor N5 is supplied with an input voltage D2. When the input voltage D1 is higher than the input voltage D2, an output voltage D3 is "H". When the input voltage D1 is lower than the input voltage D2, the output voltage D3 is "L".

In FIG. 9, the hybrid switching circuit 23 includes a P channel MOS transistor P3, an N channel MOS transistor N3, and resistors R1, R2. The transistor P3 and the transistor N3 are connected in parallel between the power supply line L1 receiving the external power supply voltage Vcc and the power supply line L2 supplied with the internal power supply voltage IVcc. The resistors R1, R2 are connected in series between the power supply line L2 and a ground terminal.

One input terminal of the differential amplifier circuit 22 is supplied with the reference voltage Vref generated from the reference voltage generating circuit 21. The other input terminal of the differential amplifier circuit 22 is supplied with a potential of a node NC between the resistors R1 and R2. An output signal of the differential amplifier circuit 22 is applied to the gate of the transistor P3. The gate of the transistor N3 is connected to the power supply line L1.

Figure 11:
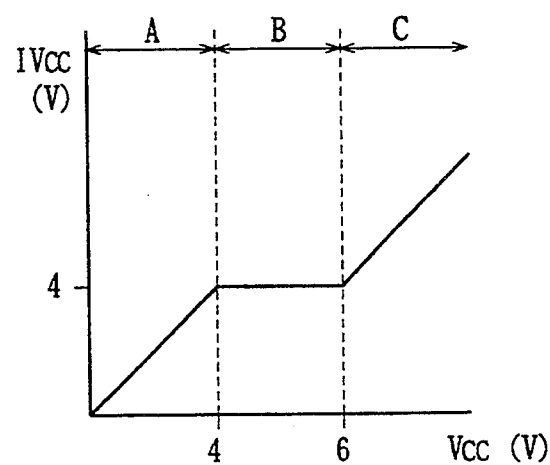
FIG. 11 is a diagram showing characteristics of the internal voltage down converting circuit of FIG. 9.
Figure 12:
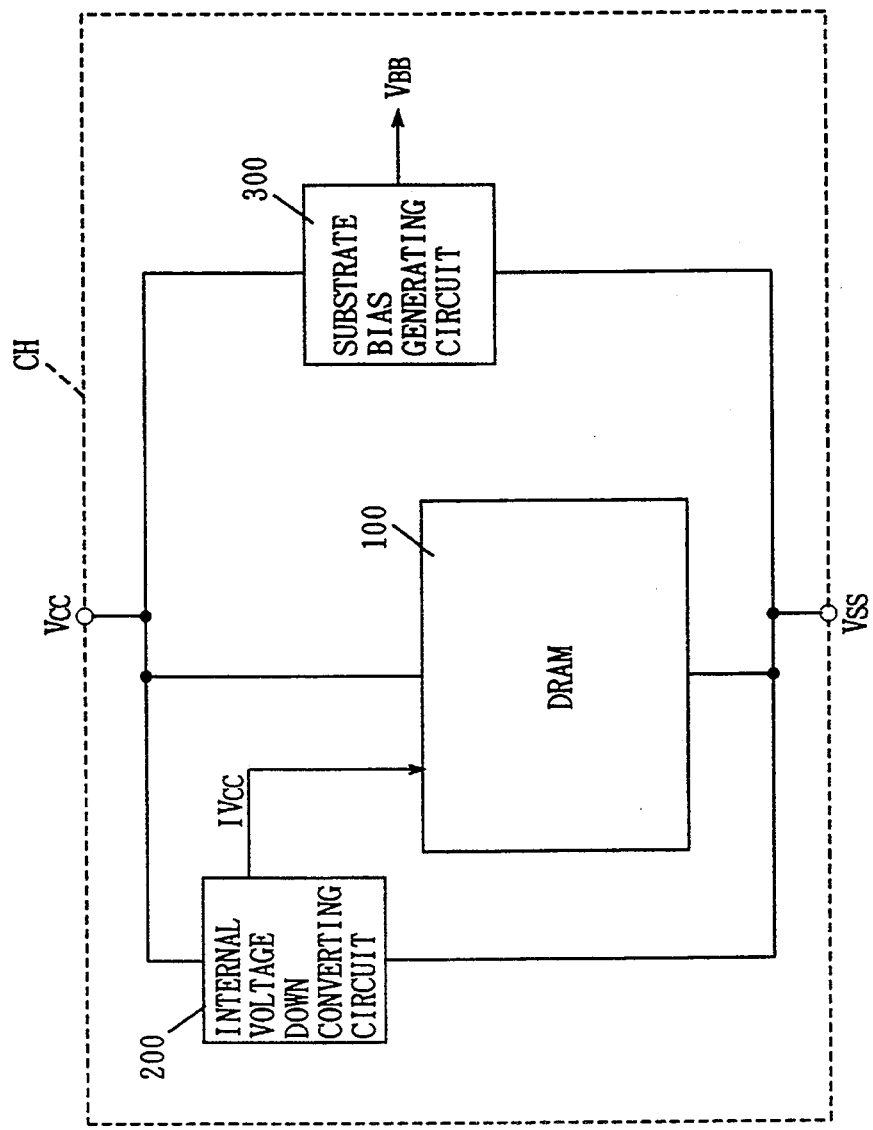
FIG. 12 is a block diagram showing a structure of a conventional semiconductor memory device.

FIG. 11 is a diagram showing characteristics of the internal voltage down converting circuit 2 shown in FIG. 9. Referring to FIG. 11, the operation of the internal voltage down converting circuit 2 of FIG. 9 will be described. For example, the constant reference voltage Vref is approximately 2.3 V, the external power supply voltage Vcc is 5 V, and the threshold voltage Vth of the transistor N3 is 2 V.

In a region A (a range where the external power supply voltage is not less than 0 V and not more than 4 V) in FIG. 11, the voltage Vcc−Vth is applied to the power supply line L2 by the transistor N3 in the on state. The voltage is divided by the resistors R1, R2, and the divided voltage appears at the node NC.

At this time, since the potential of the node NC is lower than the reference voltage Vref, an output signal of the differential amplifier circuit 22 is complete "L", and thus the transistor P3 is completely turned on. As a result, the power supply line L2 is supplied with the external power supply voltage Vcc, which results in IVcc=Vcc.

In a region B (a range where the external power supply voltage Vcc is not less than 4 V and not more than 6 V) of FIG. 11, the on state of the transistor P3 is weakened with the rise of the external power supply voltage Vcc. As a result, the internal power supply voltage IVcc is retained to a constant voltage (4 V).

In a region C (a range where the external power supply voltage Vcc is not less than 6 V) of FIG. 11, the potential of the node NC is higher than the reference voltage Vref. Consequently, an output signal of the differential amplifier circuit 22 is "H", and the transistor P3 is completely turned off. As a result, the power supply line L2 is supplied with a voltage by the transistor N3 in the on state, which results in IVcc=Vcc−Vth.

The structure of the internal voltage down converting circuit 2 shown in FIG. 1 is not limited to the structure shown in FIG. 9. A semiconductor memory device including an internal voltage down converting circuit is disclosed, for example, in the Japanese Patent Laying-Open No. 2-198096.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate comprising:
   voltage converting means for converting an external power supply voltage to an internal power supply voltage lower than the external power supply voltage;
   storage means, coupled to said voltage converting means and driven by said internal power supply voltage, for storing data;
   substrate bias generating means, coupled to said voltage converting means and driven by a drive voltage, for generating from said drive voltage a substrate bias voltage for retaining said semiconductor substrate at a constant voltage; and
   switching means, coupled to said substrate bias voltage generating means and said voltage converting means, for selectively switching the drive voltage to said substrate bias generating means between said external power supply voltage and said internal power supply voltage, depending on whether said storage means is in an active state or in a standby state.

2. The semiconductor memory device according to claim 1, wherein said switching means applies said external power supply voltage as a drive voltage to said substrate bias generating means when said storage means is in an active state, and applies said internal power supply voltage as a drive voltage to said substrate bias generating means when said storage means is in a standby state.

3. The semiconductor memory device according to claim 1, wherein
said substrate bias generating means includes
a first substrate bias generating means driven by said external power supply voltage, and
a second substrate bias generating means driven by said internal power supply voltage, and
said switching means activates said first substrate bias generating means and inactivates said second substrate bias generating means when said storage means is in an active state, and inactivates said first substrate bias generating means and activates said second substrate bias generating means when said storage means is in a standby state.

4. A semiconductor memory device formed on a semiconductor substrate comprising:
voltage converting means for converting an external power supply voltage to an internal power supply voltage lower than the external power supply voltage;
storage means, coupled to said voltage converting means and driven by said internal power supply voltage, for storing data;
substrate bias generating means, coupled to said voltage converting means and driven by a drive voltage, for generating from said drive voltage a substrate bias voltage for retaining said semiconductor substrate at a constant voltage;
wherein said substrate bias generating means comprises
a first substrate bias generating means driven by said external power supply voltage, and
second substrate bias generating means driven by said internal power supply voltage,
said second substrate bias generating means being always in an active state, and
switching means activates said first substrate bias generating means when said storage means is in an active state, and inactivates said first substrate bias generating means when said storage means is in a standby state.

5. The semiconductor memory device according to claim 1, wherein
said storage means receives an externally applied control signal, said storage means being in an active state when said control signal is in a first state, and being in a standby state when said control signal is in a second state, and
said switching means switches a drive voltage of said substrate bias generating means in response to the state of said control signal.

6. The semiconductor memory device according to claim 5, wherein
said storage means comprises a dynamic random access memory, and said control signal comprises a row address strobe signal.

7. The semiconductor memory device according to claim 1, further comprising
further substrate bias generating means driven by said external power supply voltage or said internal power supply voltage for generating the substrate bias, and
level detecting means for detecting a level of the substrate bias generated by said further substrate bias generating means, and activating said further substrate bias generating means until said substrate bias attains a predetermined level, and thereafter inactivating said further substrate bias generating means.

8. The semiconductor memory device according to claim 7, wherein
said substrate bias generating means comprises capacitance means having a predetermined capacitance value, and
said further substrate bias generating means comprises capacitance means having a larger capacitance value than said predetermined capacitance value.

9. The semiconductor memory device according to claim 2, further comprising
further substrate bias generating means driven by said external power supply voltage or said internal power supply voltage for generating the substrate bias, and
level detecting means for detecting the substrate bias generated by said further substrate bias generating means, to activate said further substrate bias generating means until said substrate bias attains a predetermined level, and thereafter inactivate said further substrate bias generating means,
wherein said switching means applies said external power supply voltage as a drive voltage to said further substrate bias generating means when said storage means is in an active state, and applies said internal power supply voltage as a drive voltage to said further substrate bias generating means when said storage means is in a standby state.

10. The semiconductor memory device according to claim 9, wherein
said substrate bias generating means comprises capacitance means having a predetermined capacitance value, and
said further substrate bias generating means comprises capacitance means having a larger capacitance value than said predetermined capacitance value.

11. The semiconductor memory device according to claim 3, further comprising
further substrate bias generating means driven by said external power supply voltage for generating the substrate bias, and
level detecting means for detecting a level of the substrate bias generated by said further substrate bias generating means, to activate said further substrate bias generating means until said substrate bias attains a predetermined level, and thereafter inactivate said further substrate bias generating means.

12. The semiconductor memory device according to claim 11, wherein
each of said first and second substrate bias generating means comprises capacitance means having a predetermined capacitance value, and
said further substrate bias generating means comprises capacitance means having a larger capacitance value than said predetermined capacitance value.

13. The semiconductor memory device according to claim 4, further comprising
first further substrate bias generating means driven by said external power supply voltage for generating the substrate bias,
first level detecting means for detecting a level of the substrate bias generated by said first further substrate bias generating means to activate said first further substrate bias generating means until said substrate bias attains a predetermined level when said storage means is in an active state, second further substrate bias generating means driven by said internal power supply voltage for generating the substrate bias, and second level detecting means for detecting a level of the substrate bias generated by said second further substrate bias generating means to activate said second further substrate bias generating means until said substrate bias attains a predetermined level, and thereafter to inactivate said second further substrate bias generating means.

14. The semiconductor memory device according to claim 13, wherein
each of said first and second further substrate bias generating means comprises capacitance means having a predetermined capacitance value, and
each of said first and second further substrate bias generating means comprises capacitance means having a larger capacitance value than said predetermined capacitance value.

15. A method of operating a semiconductor memory device formed on a semiconductor substrate comprising voltage converting means for converting an external power supply voltage to an internal power supply voltage; storage means, coupled to said voltage converting means and driven by said internal power supply voltage, for storing data; substrate bias generating means, coupled to said voltage converting means, for generating a substrate bias voltage for retaining said semiconductor substrate at a constant voltage; and switching means, coupled to said substrate bias voltage generating means and said voltage converting means, for selectively switching a drive voltage of said substrate bias generating means, the method comprising the steps of:
converting an external power supply voltage with said voltage converting means to an internal power supply voltage lower than the external power supply voltage,
switching with said switching means the drive voltage to said substrate bias generating means between said external power supply voltage and said internal power supply voltage, depending on whether said storage means is in an active state or in a standby state, and
generating a substrate bias voltage with said substrate bias generating means from said drive voltage switched by said switching means.

16. The operating method according to claim 15, wherein
said switching step comprises applying said external power supply voltage as a drive voltage to said substrate bias generating means when said storage means is in an active state, and applying said internal power supply voltage as a drive voltage to said substrate bias generating means when said storage means is in a standby state.

17. The operating method according to claim 15, wherein
said substrate bias generating means comprises first substrate bias generating means driven by said external power supply voltage, and second substrate bias generating means driven by said internal power supply voltage, and
said switching step comprises activating said first substrate bias generating means and inactivating said second substrate bias generating means when said storage means is an active state, and inactivating said first substrate bias generating means and activating said second substrate bias generating means when said storage means is in a standby state.

18. A method of operating a semiconductor memory device formed on a semiconductor substrate comprising voltage converting means for converting an external power supply voltage to an internal power supply voltage; storage means, coupled to said voltage converting means and driven by said internal power supply voltage, for storing data; substrate bias generating means, coupled to said voltage converting means, for generating a substrate bias voltage for retaining said semiconductor substrate at a constant voltage; and switching means, coupled to said substrate bias voltage generating means and said voltage converting means, for selectively switching a drive voltage of said substrate bias generating means, said substrate bias generating means comprising a first substrate bias generating means driven by said external power supply voltage, and a second substrate bias generating means driven by said internal power supply voltage, said second substrate bias generating means being always in an active state, the method comprising the steps of:
converting an external power supply voltage with said voltage converting means to an internal power supply voltage lower than the external power supply voltage,
generating a substrate bias voltage with said substrate bias generating means; and
activating said first substrate bias generating means when said storage means is in an active state, and inactivating said first substrate bias generating means when said storage means is in a standby state.

19. A semiconductor memory device formed on a semiconductor substrate comprising:
converting means for converting an external power supply voltage to an internal power supply voltage lower than the external power supply voltage;
storage means driven by said internal power supply voltage for storing data;
substrate bias generating means driven by said external power supply voltage or said internal power supply voltage for generating a substrate bias for retaining said semiconductor substrate at a constant voltage, said substrate bias generating means comprising:
a first substrate bias generating means driven by said external power supply voltage, and
a second substrate bias generating means driven by said internal power supply voltage; and
switching means for switching a drive voltage of said substrate bias generating means between said external power supply voltage and said internal power supply voltage, depending on whether said storage means is in an active state or in a standby state, wherein said switching means activates said first substrate bias generating means and inactivates said second substrate bias generating means when said storage means is in an active state, and inactivates said first substrate bias generating means and activates said second substrate bias generating means when said storage means is in a standby state.

20. A semiconductor memory device formed on a semiconductor substrate comprising:

converting means for converting an external power supply voltage to an internal power supply voltage lower than the external power supply voltage;

storage means driven by said internal power supply voltage for storing data;

substrate bias generating means driven by said external power supply voltage or said internal power supply voltage for generating a substrate bias for retaining said semiconductor substrate at a constant voltage, said substrate bias generating means comprising:

a first substrate bias generating means driven by said external power supply voltage, and second substrate bias generating means driven by said internal power supply voltage; and switching means for switching a drive voltage of said substrate bias generating means between said external power supply voltage and said internal power supply voltage, depending on whether said storage means is in an active state or in a standby state, wherein said second substrate bias generating means being always in an active state, and said switching means activates said first substrate bias generating means when said storage means is in an active state, and inactivates said first substrate bias generating means when said storage means is in a standby state.

21. A semiconductor memory device formed on a semiconductor substrate comprising:

converting means for converting an external power supply voltage to an internal power supply voltage lower than the external power supply voltage;

storage means driven by said internal power supply voltage for storing data;

substrate bias generating means driven by said external power supply voltage or said internal power supply voltage for generating a substrate bias for retaining said semiconductor substrate at a constant voltage; and switching means for switching a drive voltage of said substrate bias generating means between said external power supply voltage and said internal power supply voltage, depending on whether said storage means is in an active state or in a standby state, wherein said storage means receives an externally applied control signal, said storage means being in an active state when said control signal is in a first state, and being in a standby state when said control signal is in a second state, and said switching means switches a drive voltage of said substrate bias generating means in response to the state of said control signal.

22. The semiconductor memory device according to claim 21, wherein said storage means comprises a dynamic random access memory, and said control signal comprises a row address strobe signal.

23. A semiconductor memory device formed on a semiconductor substrate comprising:

converting means for converting an external power supply voltage to an internal power supply voltage lower than the external power supply voltage;

storage means driven by said internal power supply voltage for storing data;

substrate bias generating means driven by said external power supply voltage or said internal power supply voltage for generating a substrate bias for retaining said semiconductor substrate at a constant voltage;

switching means for switching a drive voltage of said substrate bias generating means between said external power supply voltage and said internal power supply voltage, depending on whether said storage means is in an active state or in a standby state;

further substrate bias generating means driven by said external power supply voltage or said internal power supply voltage for generating the substrate bias; and level detecting means for detecting a level of the substrate bias generated by said further substrate bias generating means, and activating said further substrate bias generating means until said substrate bias attains a predetermined level, and thereafter inactivating said further substrate bias generating means.

24. The semiconductor memory device according to claim 23, wherein said substrate bias generating means comprises capacitance means having a predetermined capacitance value, and said further substrate bias generating means comprises capacitance means having a larger capacitance value than said predetermined capacitance value.

25. A semiconductor memory device formed on a semiconductor substrate comprising:

converting means for converting an external power supply voltage to an internal power supply voltage lower than the external power supply voltage;

storage means driven by said internal power supply voltage for storing data;

substrate bias generating means driven by said external power supply voltage or said internal power supply voltage for generating a substrate bias for retaining said semiconductor substrate at a constant voltage;

switching means for switching a drive voltage of said substrate bias generating means between said external power supply voltage and said internal power supply voltage, depending on whether said storage means is in an active state or in a standby state;

further substrate bias generating means driven by said external power supply voltage or said internal power supply voltage for generating the substrate bias; and level detecting means for detecting the substrate bias generated by said further substrate bias generating means, to activate said further substrate bias generating means until said substrate bias attains a predetermined level, and thereafter inactivate said further substrate bias generating means, wherein said switching means applies said external power supply voltage as a drive voltage to said substrate bias generating means when said storage means is in an active state, and applies said internal power supply voltage as a drive voltage to said substrate bias generating means when said storage means is in a standby state and said switching means applies said external power supply voltage as a driven voltage to said further substrate bias generating means when said storage means is in an active state, and applies said internal power supply voltage as a drive voltage to said further substrate bias generating means when said storage means is in a standby state.

26. The semiconductor memory device according to claim 25, wherein said substrate bias generating means comprises capacitance means having a predetermined capacitance value, and said further substrate bias generating means comprises capacitance means having a larger capacitance value than said predetermined capacitance value.

27. The semiconductor memory device according to claim 19, further comprising
further substrate bias generating means driven by said external power supply voltage for generating the substrate bias, and
level detecting means for detecting a level of the substrate bias generated by said further substrate bias generating means, to activate said further substrate bias generating means until said substrate bias attains a predetermined level, and thereafter inactivate said further substrate bias generating means.

28. The semiconductor memory device according to claim 27, wherein
each of said first and second substrate bias generating means comprises capacitance means having a predetermined capacitance value, and
said further substrate bias generating means comprises capacitance means having a larger capacitance value than said predetermined capacitance value.

29. A semiconductor memory device formed on a semiconductor substrate comprising:
converting means for converting an external power supply voltage to an internal power supply voltage lower than the external power supply voltage;
storage means driven by said internal power supply voltage for storing data;
substrate bias generating means for generating a substrate bias far retaining said semiconductor substrate at a constant voltage;
first further substrate bias generating means driven by said external power supply voltage for generating the substrate bias;
first level detecting means for detecting a level of the substrate bias generated by said first further substrate bias generating means to activate said first further substrate bias generating means until said substrate bias attains a predetermined level when said storage means is in an activate state;
second further substrate bias generating means driven by said internal power supply voltage for generating the substrate bias;
second level detecting means for detecting a level of the substrate bias generated by said second further substrate bias generating means to activate said second further substrate bias generating means until said substrate bias attains a predetermined level, and thereafter to inactivate said second further substrate bias generating means; and
switching means for selectively activating said first further substrate bias generating means in response to the state of an externally applied control signal, and
wherein said storage means receives said externally applied control signal, said storage means being in an active state when said control signal is in a first state, and being in a standby state when said control signal is in a second state 30. The semiconductor memory device according to claim 29, wherein each of said first and second further substrate bias generating means comprises capacitance means having a predetermined capacitance value, and
each of said first and second further substrate bias generating means comprises capacitance means having a larger capacitance value than said predetermined capacitance value.

31. An operating method of a semiconductor memory device comprising storage means and substrate bias generating means formed on a semiconductor substrate comprising the steps of:
converting an external power supply voltage to an internal power supply voltage lower than the external power supply voltage, and
switching a drive voltage of said substrate bias generating means between said external power supply voltage and said internal power supply voltage, depending on whether said storage means is in an active state or in a standby state,
wherein said substrate bias generating means comprises first substrate bias generating means driven by said external power supply voltage, and second substrate bias generating means driven by said internal power supply voltage, and said switching step comprises activating said first substrate bias generating means and inactivating said second substrate bias generating means when said storage means is an active state, and inactivating said first substrate bias generating means and activating said second substrate bias generating means when said storage means is in a standby state.

32. An operating method of a semiconductor memory device comprising storage means end substrate baas generating means formed on a semiconductor substrate, said substrate bias generating means comprising a first substrate bias generating means driven by an external power supply voltage, and a second substrate bias generating means driven by an internal power supply voltage, said second substrate bias generating means being always in an active state, said method comprising the steps of:
converting an external power supply voltage to an internal power supply voltage lower than the external power supply voltage, and
activating said first substrate bias generating means when said storage means is in an active state, and inactivating said first substrate bias generating means when said storage means is in a standby state.

* * * * *